(12) United States Patent
Hishiki et al.

(10) Patent No.: US 9,870,930 B2
(45) Date of Patent: Jan. 16, 2018

(54) METHOD FOR PRODUCING SUBSTRATE FOR MOUNTING SEMICONDUCTOR ELEMENT

(71) Applicant: SH MATERIALS CO., LTD., Tokyo (JP)

(72) Inventors: Kaoru Hishiki, Isa (JP); Shunichi Kidoguchi, Isa (JP); Hiroki Nakayama, Isa (JP)

(73) Assignee: SH MATERIALS CO., LTD., Tokyo (JP)

( * ) Notice: Subject to any disclaimer, the term of this patent is extended or adjusted under 35 U.S.C. 154(b) by 0 days.

(21) Appl. No.: 14/786,831

(22) PCT Filed: Mar. 11, 2014

(86) PCT No.: PCT/JP2014/056307
§ 371 (c)(1),
(2) Date: Oct. 23, 2015

(87) PCT Pub. No.: WO2014/174925
PCT Pub. Date: Oct. 30, 2014

(65) Prior Publication Data
US 2016/0079091 A1    Mar. 17, 2016

(30) Foreign Application Priority Data
Apr. 24, 2013    (JP) ................. 2013-091556

(51) Int. Cl.
*H01L 21/48*    (2006.01)
*H01L 23/498*    (2006.01)

(52) U.S. Cl.
CPC ...... *H01L 21/4825* (2013.01); *H01L 21/4828* (2013.01); *H01L 21/4846* (2013.01); *H01L 23/49866* (2013.01); *H01L 2924/0002* (2013.01)

(58) Field of Classification Search
CPC ............ H01L 21/4825; H01L 21/4828; H01L 21/4846; H01L 23/49866; H01L 2924/0002; H01L 2924/00
(Continued)

(56) References Cited

U.S. PATENT DOCUMENTS 3,821,376 A * 6/1974 Bayer et al. ......... C07D 231/12
514/184
4,749,449 A * 6/1988 Scott ...................... C25D 5/022
205/136
(Continued)

FOREIGN PATENT DOCUMENTS

EP    1054270 A1    11/2000
EP    2082891 A2    7/2009
(Continued)

OTHER PUBLICATIONS

International Search Report dated May 20, 2014 during prosecution of International Application No. PCT/JP2014/056307.

*Primary Examiner* — Caridad Everhart
(74) *Attorney, Agent, or Firm* — Troutman Sanders LLP

(57) ABSTRACT

Methods for producing a substrate for semiconductor element mounts are provided. A base substrate can be prepared having on a first metal layer, a second metal layer through which a metal layer for instrumentation is hardly diffusible. A patterned resist mask layer on the second metal layer can be formed. A surface of the second metal layer under reprocessing treatment can form a reprocessed surface which can be provided with an organic film that controls adhesion between the metal layer for instrumentation and the reprocessed surface by a liquid agent containing a component that shows the nature of amphoteric surfactant. The metal layer for instrumentation can be formed on the reprocessed surface via the organic film. A semiconductor element mount portion and an electrode terminal portion can (Continued)

be electroformed on the metal layer for instrumentation. The resist mask from the second metal layer of the base substrate may be removed.

12 Claims, 8 Drawing Sheets

(58) Field of Classification Search
USPC .......................................................... 438/111
See application file for complete search history.

(56) References Cited

U.S. PATENT DOCUMENTS

| | | | |
|---|---|---|---|
| 5,532,910 A * | 7/1996 | Suzuki | H01L 21/67121 |
| | | | 174/536 |
| 6,017,777 A * | 1/2000 | Kim | H01L 23/49582 |
| | | | 205/224 |
| 6,437,918 B1 | 8/2002 | Hamanaka | |
| 6,593,643 B1 * | 7/2003 | Seki | H01L 23/49582 |
| | | | 257/677 |
| 2001/0030059 A1 * | 10/2001 | Sugaya | H01L 21/56 |
| | | | 174/256 |
| 2004/0178492 A1 * | 9/2004 | Tsukamoto | H01L 23/49822 |
| | | | 257/690 |
| 2006/0166847 A1 * | 7/2006 | Walker | C11D 7/261 |
| | | | 510/175 |
| 2007/0269590 A1 * | 11/2007 | Miyamoto | H01L 21/4832 |
| | | | 427/125 |
| 2009/0181190 A1 | 7/2009 | Tsubaki | |
| 2010/0056409 A1 * | 3/2010 | Walker | C11D 7/06 |
| | | | 201/175 |
| 2011/0201159 A1 * | 8/2011 | Mori | H01L 21/4832 |
| | | | 438/123 |
| 2012/0118753 A1 * | 5/2012 | Lutzow | H05K 3/205 |
| | | | 205/126 |
| 2015/0090481 A1 * | 4/2015 | Sun | H01L 24/85 |
| | | | 174/257 |

FOREIGN PATENT DOCUMENTS

| | | |
|---|---|---|
| JP | H10-39112 A | 2/1998 |
| JP | H11-138517 A | 5/1999 |
| JP | 2005-026631 A | 1/2005 |
| JP | 2009-055055 A | 3/2009 |
| JP | 2009-166363 A | 7/2009 |
| JP | 2011-198977 A | 10/2011 |

* cited by examiner

METHOD FOR PRODUCING SUBSTRATE FOR MOUNTING SEMICONDUCTOR ELEMENT

CROSS-REFERENCE TO RELATED APPLICATIONS

This application is a U.S. National Phase application under 35 U.S.C. §371 of International Application No. PCT/JP2014/056307, filed on Mar. 11, 2014, which claims priority to Japanese Patent Application No. 2013-091556, filed on Apr. 24, 2013, both of which applications are herein incorporated by reference in their entirety.

TECHNICAL FIELD

The present invention relates to a method for producing a substrate for semiconductor element mount of surface-instrumentation type with electroformed frame.

BACKGROUND ART

Conventionally, there has been publicly known, as a surface-mount-type semiconductor device with an electroformed frame, the structure processed from a substrate for semiconductor element mount having an island portion for mounting semiconductor element thereon and an electrode portion for achieving conduction toward the external that are electroformed on an electroconductive substrate, by, after mounting a semiconductor element onto the island portion, electrically connecting the semiconductor element and the electrode portion by way of wire bonding and resin-sealing them on the electroconductive substrate, removing the electroconductive substrate alone, and cutting the sealed body into individual pieces.

For example, Japanese Unexamined Patent Application No. 2005-026631 teaches a method for producing a substrate for semiconductor element mount that is configured to have, over on the entire surface on one side of a support member, peelable layers constructed of two layers, which are a Cr layer and a Ni—Co layer, on which a conductor pattern of a desired shape made of copper material is formed. Further, Document 1 teaches that a semiconductor device is produced from this substrate by, after resin-sealing a semiconductor chip, peeling the support member off the sealing resin upon cutting notches down to the interface between the Cr layer and the Ni—Co layer, removing the remaining Ni—Co layer by etching, and forming, on the uncovered surface of the conductor pattern, a metal layer designed to function as connecting terminals to other semiconductor devices.

Japanese Unexamined Patent Application No. 2009-055055 discloses that a substrate for semiconductor device mount is produced by plating, after surface activation treatment such as microetching, an uncovered surface of an electroconductive substrate with Au or Ag as a metal layer for instrumentation, electroforming an electroformed layer, as an electroformed product, which is to be an island portion and an electrode portion, and removing a resist mask layer from the electroconductive substrate. Further, Document 2 teaches that a semiconductor device is produced from this substrate by, mounting a semiconductor element on the island portion of the electroformed product, electrically connecting the semiconductor element and the electrode portion by way of wire bonding, resin-sealing the semiconductor element, the island portion, the electrode portion and bonding wires on the electroconductive substrate, to form a resin-sealed member, peeling the electroconductive substrate to take out the resin-sealed member, and cut the resin-sealed member into pieces.

Japanese Unexamined Patent Application No. 2011-198977 teaches that, in a case where the electroconductive substrate is constructed of a first metal layer made of Cu and a second metal layer made of Ni, since formation of a metal layer to for instrumentation would cause too strong adhesion, an oxide film of desired thickness is formed on the Ni surface of the second metal layer by way of natural oxidization or oxidation treatment, to give an appropriate adhesion between the Ni layer and the electroformed product.

SUMMARY OF THE INVENTION

Problem to be Solved by the Invention

However, according to the invention taught by Patent Document 1, one of the peelable layers (Ni—Co layer, for example) needs to be removed by etching, as well as another metal film of Ni or Au should be formed on the conductor pattern for better bonding to other semiconductor devices; production processes are complicated.

According to the invention taught by Patent Document 2, in electroforming the island portion and the electrode portion, for improved adhesion of the electroconductive substrate with the island portion and the electrode portion, there is adopted a method in which the metal layer for instrumentation is formed after activation treatment of the surface of the electroconductive substrate. However, if stainless steel is used as the electroconductive substrate, this method is liable to give the microetched surface jaggedness, which then would generate nodules in the subsequent electroforming, to prevent formation of a flat and smooth surface of the island portion and the electrode portion, and then would cause defective connection in the mounting and bonding process of the semiconductor element.

In addition, in a case where electroforming is continuously conducted upon the electroconductive substrate being fed roll-to-roll, since the stainless steel has a high surface resistivity, a poor contact with a power supply electrode would cause anomalous deposition of coating as well as the necessity for high-level applied voltage is liable to result in hydrogen generation at the anode, under which circumstances pits are easily generated. If Cu is used as the electroconductive substrate, the adhesion between Cu and the metal layer for instrumentation is so strong that, when the electroconductive substrate is peeled off the resin-sealed body, the island portion and the electrode portion are liable to be deformed or left attached to the electroconductive substrate side.

Furthermore, although the invention taught by Document 3 is free from the problems in the inventions of Document 1 and Document 2 explained above, it is, in reality, quite troublesome and difficult to constantly form an oxide film with a predetermined thickness, which is an indispensable condition for the invention to be conformed with factory-based mass-production.

The present invention was made in consideration of the above-mentioned problems. The object of the present invention is to provide a method for producing a substrate for semiconductor element mount that makes it possible to stably produce, in a highly mass-productive manner, surface-mount type semiconductor devices with an appropriately set adhesion between the electroformed product and the base substrate upon avoiding generation of the above-mentioned defects.

Measures to Solve the Problem

In order to solve the above-mentioned problem, a method for producing a substrate for semiconductor element mount according to the present invention is characterized by sequentially passing through the following processes (1) to (7):

(1) a process of preparing a base substrate having, on a first metal layer, a second metal layer through which a metal layer for instrumentation is hardly diffusible;

(2) a process of forming a patterned resist mask layer on the second metal layer of the base substrate;

(3) a process of placing a surface of the second metal layer remaining uncovered off the resist mask layer under reprocessing treatment, to form a reprocessed surface;

(4) a process of providing the reprocessed surface of the base substrate with an organic film that controls adhesion between the metal layer for instrumentation and the reprocessed surface by a liquid agent containing a component that shows the nature of amphoteric surfactant;

(5) a process of forming the metal layer for instrumentation on the reprocessed surface of the base substrate via the organic film;

(6) a process of forming, on the metal layer for instrumentation, a semiconductor element mount portion and an electrode terminal portion by electroforming; and (7) a process of removing the resist mask from the second metal layer of the base substrate.

Alternatively, a method for producing a substrate for semiconductor element mount according to the present invention is characterized by sequentially passing through the following processes (1) to (6):

(1) a process of preparing a base substrate having, on a first metal layer, a second metal layer through which a metal layer for instrumentation is hardly diffusible;

(2) a process of forming a patterned resist mask layer on the second metal layer of the base substrate;

(3) a process of providing the second metal layer of the base substrate with an organic film that controls adhesion between the metal layer for instrumentation and the second metal layer by a liquid agent containing a component that shows the nature of amphoteric surfactant;

(4) a process of forming the metal layer for instrumentation on the second metal layer of the base substrate via the organic film;

(5) a process of forming, on the metal layer for instrumentation, a semiconductor element mount portion and an electrode terminal portion by electroforming; and (6) a process of removing the resist mask from the second metal layer of the base substrate.

In addition to the above-described invention, the method for producing a substrate for semiconductor element mount according to the present invention is characterized in that the component that shows the nature of amphoteric surfactant is betaine-type, aminoxide-type or amino acid-type.

In addition to the above-described invention, the method for producing a substrate for semiconductor element mount according to the present invention is characterized in that the reprocessing treatment for forming the reprocessed surface is Ni electroplating or NiP electroplating.

In addition to the above-described invention, the method for producing a substrate for semiconductor element mount according to the present invention is characterized in that the reprocessing treatment for forming the reprocessed surface is any one of soft etching, Ni electroplating after soft etching, and NiP electroplating after soft etching.

In addition to the above-described invention, the method for producing a substrate for semiconductor element mount according to the present invention is characterized in that the first metal layer is made of any one of Cu, SPCC and Alloy 42.

In addition to the above-described invention, the method for producing a substrate for semiconductor element mount according to the present invention is characterized in that the second metal layer is made of Ni or NiP.

In addition to the above-described invention, the method for producing a substrate for semiconductor element mount according to the present invention is characterized in that the metal layer for instrumentation is made of any one of Au, Pd and Au/Pd.

Effect of the Invention

According to the present invention, it is possible to stably mass-produce substrates for semiconductor element mount of surface-instrumentation type with an appropriately set adhesion between the electroformed product and the base substrate.

BRIEF DESCRIPTION OF THE DRAWINGS

FIG. 1G' is a plan view of the electrode terminal portion and the semiconductor element mount portion.

FIG. 2G' is a plan view of the electrode terminal portion and the semiconductor element mount portion.

FIG. 3G' is a plan view of the electrode terminal portion and the semiconductor element mount portion.

FIG. 4F' is a plan view of the electrode terminal portion and the semiconductor element mount portion.

FIG. 5G' is a plan view of the electrode terminal portion and the semiconductor element mount portion.

FIG. 6G' is a plan view of the electrode terminal portion and the semiconductor element mount portion.

FIG. 7G' is a plan view of the electrode terminal portion and the semiconductor element mount portion.

FIG. 8G' is a plan view of the electrode terminal portion and the semiconductor element mount portion.

MODE FOR CARRYING OUT THE INVENTION

Figure 1A:
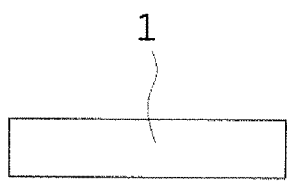
FIGS. 1A-1G are diagrams that show Embodiments 1 to 9 of the method for producing a substrate for semiconductor element mount according to the present invention, arranged in sequential order of processes.

The method for producing a substrate for semiconductor element mount according to the present invention is characterized by sequentially passing through the following processes (1) to (7):

(1) a process of preparing a base substrate having, on a first metal layer, a second metal layer through which a metal layer for instrumentation is hardly diffusible;

(2) a process of forming a patterned resist mask layer on the second metal layer of the base substrate;

(3) a process of placing a surface of the second metal layer remaining uncovered off the resist mask layer under reprocessing treatment, to form a reprocessed surface;

(4) a process of providing the reprocessed surface of the base substrate with an organic film that controls adhesion of the metal layer for instrumentation to the reprocessed surface by a liquid agent containing a component that shows the nature of amphoteric surfactant;

(5) a process of forming the metal layer for instrumentation on the reprocessed surface of the base substrate via the organic film;

(6) a process of forming, on the metal layer for instrumentation, a semiconductor element mount portion and an electrode terminal portion by electroforming; and (7) a process of removing the resist mask from the second metal layer of the base substrate.

Before the electroforming process, by placing the surface of the second metal layer under reprocessing treatment to form a reprocessed surface and providing the reprocessed surface with an organic film that controls adhesion between the metal layer for instrumentation and the reprocessed surface, the adhesion between the reprocessed surface and the electroformed product can be appropriately set, to prevent deformation or incomplete detachment of the electroformed product, which could be resulted from a removing process of the base substrate from the resin-sealed body.

The organic film is formed by adsorption, onto the reprocessed surface, of the liquid agent containing a component that shows the nature of amphoteric surfactant. The metal layer for instrumentation is formed by adhesion of a metal for instrumentation via apertures in the organic film of the reprocessed surface. The amphoteric surfactant used in the present invention is a surfactant with a hydrophilic group charged positively or negatively in accordance with pH; it changes its ionicity dependent on pH of the solution. The density of the organic film relies on pH of the organic film liquid. A high pH forms an organic film with a high density, to give a low adhesion of the metal layer for instrumentation to the reprocessed surface. Whereas, a low pH forms an organic film with a low density, to give a high adhesion of the metal layer for instrumentation to the reprocessed surface.

For the second metal layer (with a reprocessed surface), use of a metal through which the metal layer for instrumentation is hardly diffusible can prevent the metal layer for instrumentation from diffusing into the first metal layer in a process of bonding upon a semiconductor element being mounted, and can preclude defects such as poor solderability in instrumentation of the semiconductor device. Furthermore, since even by heat treatment in a process such as resin-sealing, the metal layer for instrumentation is hardly diffusible into the reprocessed surface of the second metal layer, the adhesion between the metal layer for instrumentation and the reprocessed surface of the second metal layer is kept at an appropriate level, to allow detachment to occur rightly at the boundary between the metal layer for instrumentation and the reprocessed surface of the second metal layer in the process of removing the base substrate by peeling it off.

In this way, the substrate for semiconductor element mount produced in accordance with the method of the present invention, which dispenses with a process of plating with a metal layer for instrumentation after removal of the base substrate from the resin-sealed body and makes it possible to form the metal layer for instrumentation in the successive process after the electroforming process, excels in mass-productivity, to be produced inexpensively.

Although being dispensable as described later, formation of a reprocessed surface is preferable, for the surface of the second metal layer may be stained during the process of forming a patterned resist mask layer. If no reprocessed surface is formed, the adhesion between the organic film and the metal layer for instrumentation may be rendered uneven, to cause problems such as unusual adhesion or exfoliation. Cleaning of the surface may work, as an alternative process, in replace of formation of a reprocessed surface. However, in some cases sufficient cleaning is difficult, and thus formation of a reprocessed surface is more reliable.

Also, the method for producing a substrate for semiconductor element mount according to the present invention is characterized by sequentially passing through the following processes (1) to (6):

(1) a process of preparing a base substrate having, on a first metal layer, a second metal layer through which a metal layer for instrumentation is hardly diffusible;

(2) a process of forming a patterned resist mask layer on the second metal layer of the base substrate;

(3) a process of providing the second metal layer of the base substrate with an organic film that controls adhesion between the metal layer for instrumentation and the second metal layer by a liquid agent containing a component that shows the nature of amphoteric surfactant;

(4) a process of forming the metal layer for instrumentation on the second metal layer of the base substrate via the organic film;

(5) a process of forming, on the metal layer for instrumentation, a semiconductor element mount portion and an electrode terminal portion by electroforming; and (6) a process of removing the resist mask from the second metal layer of the base substrate.

Before the electroforming process, by providing the surface of the second metal layer with an organic film that controls adhesion, the adhesion between the second metal layer and the electroformed product (metal layer for instrumentation) can be appropriately set, to prevent deformation or incomplete detachment of the electroformed product, which could be resulted from a removing process of the base substrate from the resin-sealed body.

The organic film is formed by adsorption, onto the second metal layer, of the liquid agent containing a component that shows the nature of amphoteric surfactant. The metal layer for instrumentation is formed by adhesion of a metal for instrumentation to the second metal layer via apertures in the organic film. The amphoteric surfactant used in the present invention is a surfactant with a hydrophilic group charged positively or negatively in accordance with pH; it changes its ionicity dependent on pH of the solution. The density of the organic film relies on pH of the organic film liquid. A high pH forms an organic film with a high density, to give a low adhesion of the metal layer for instrumentation to the second metal layer. Whereas, a low pH forms an organic film with a low density, to give a high adhesion of the metal layer for instrumentation to the second metal layer.

As discussed above, formation of a reprocessed surface is preferable, for the surface of the second metal layer may be stained during the process of forming a patterned resist mask layer. However, if the cleanness of the uncovered part of the surface of the second metal layer is kept at a sufficient level as not to affect the metal layer for instrumentation via the organic film, formation of a reprocessed surface is not necessary. In this case, since the process of forming a reprocessed surface is not necessary, the production procedure is simplified.

According to the method for producing a substrate for semiconductor element mount of the present invention, the component that shows the nature of amphoteric surfactant is preferably betaine-type, aminoxide-type or amino acid-type.

The liquid agent containing a component that shows the nature of amphoteric surfactant is adsorbed to cover the metal surface, to thereby form an organic film. Examples of the betaine-type amphoteric surfactant include carboxymetaine. Examples of the aminoxide-type amphoteric surfactant include lauryldimethylamine n-oxide. Examples of the amino acid-type amphoteric surfactant include sodium lauroyl glutamate. A liquid agent containing a component that shows the nature of amphoteric surfactant, even other than betaine-type, aminoxide-type or amino acid-type, can form an organic film.

In this regard, there is no particular limitation to material to form the second metal layer or the reprocessed surface; it is effective not only for Ni taught by the present invention, but also for commonly used lead frame metals.

According to the method for producing a substrate for semiconductor element mount of the present invention, the reprocessing treatment for forming the reprocessed surface is preferably Ni electroplating or NiP electroplating.

Basically, in a case where the second metal layer is formed by Ni electroplating, the reprocessed surface also is formed by Ni electroplating. In a case where the second metal layer is formed by NiP electroplating, the reprocessed surface also is formed by NiP electroplating.

If the single substance Ni is used, the terminal bonding strength is increased after heat treatment. To minimize this phenomenon, an NiP layer can work. This is because amorphousness of NiP can lower thermal diffusion of Au, of which the metal layer for instrumentation is formed on the NiP layer. NiP is a most suitable material for the present invention in view of: control for an appropriate peel strength, which is the very object of the present invention; it being a material that can minimize ill effects on the terminals in instrumentation; and it being economical.

Making the reprocessed surface and the second metal layer of an identical material is not always necessary for attaining the object of the invention, but is preferred because diffusion of the second metal layer into the metal layer for instrumentation would affect wire bondability and peeling off after assembly.

According to the method for producing a substrate for semiconductor element mount of the present invention, the reprocessing treatment for forming the reprocessed surface is preferably soft etching, Ni electroplating after soft etching, or NiP electroplating after soft etching.

As described above, since the surface of the second metal layer may be stained in the process of forming a patterned resist mask layer, it is preferred to form a reprocessed surface. If the stain is minor, only soft etching is required. This can make the surface constantly finished in the same condition.

If formation of a completely new processed surface is desired, Ni electroplating after soft etching or NiP electroplating after soft etching should be conducted. This can form a reprocessed surface, and, in addition, standoffs.

According to the method for producing a substrate for semiconductor element mount of the present invention, the first metal layer is preferably made of any one of Cu, SPCC (cold rolled steel sheet) and Alloy 42 (alloy of 57% Fe and 42% Ni).

According to the method for producing a substrate for semiconductor element mount of the present invention, the second metal layer is preferably made of Ni or NiP.

Basically, the second metal layer is formed by Ni electroplating or NiP electroplating irrespective of whether reprocessing treatment should be made after that. If the single substance Ni is used, the terminal bonding strength is increased after heat treatment. To minimize this phenomenon, an NiP layer can work. This is because amorphousness of NiP can lower heat diffusion of Au, of which the metal layer for instrumentation is formed on the NiP layer.

According to the method for producing a substrate for semiconductor element mount of the present invention, the metal layer for instrumentation is preferably made of any one of Au, Pd and Au/Pd. The metal layer for instrumentation may be made of other materials; Ni/Pd/Au may work, for example.

The embodiments of the present invention will be explained below in reference to FIGS. 1 to 8. In the following explanation of the embodiments, while there is referred to only the method for forming an electroformed product that is to be a semiconductor element mount portion with an uppermost layer as a semiconductor element mount layer, the same is applied to the method for producing an electroformed product that is to be an electrode terminal portion. Basically, the semiconductor element mount portion and the electrode terminal portion are simultaneously formed, as shown in the figures.

EMBODIMENTS

In the following embodiments, the product name Best Guard AgS-4 (manufactured by Chemitec Inc.) was used as the liquid agent containing a component that shows the nature of amphoteric surfactant. The specific components of this liquid agent are shown below:

Components: carboxybetaine 10.0 wt %
    tetramethylthiuram monosulfide 4.5 wt %
    mercaptobenzimidazole 3.0 wt %
    pure water 82.5 wt %
pH: 10 pH was adjusted by, when to increase, addition of potassium hydroxide and, when to decrease, addition of lactic acid.

Embodiment 1

Hereinafter, an explanation will be made in reference to FIGS. 1A-1G.

Figure 1B:
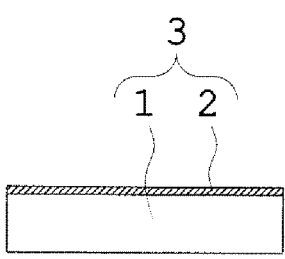
Figure 1C:
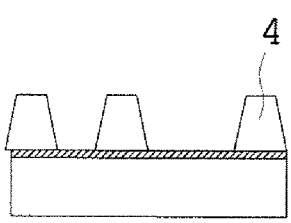

First, as shown in FIG. 1A, a Cu material of 0.15 mm thickness was used as a first metal layer 1, which was then, as shown in FIG. 1B, Ni electroplated with a second metal layer 2 of 0.3 μm, to form a base substrate 3.

Next, the base substrate was laminated with a dry film resist. Then, exposure and development using a patterned glass mask formed a resist mask layer 4 shown in FIG. 1C, which makes it possible to form an electroformed product with a tapered shape on the base substrate 3.

Figure 1D:
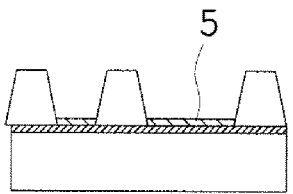

Next, as shown in FIG. 1D, the second metal layer 2, as uncovered, was Ni electroplated with 0.3 μm, to form a clean base substrate 3 with a barrier metal layer 5 formed thereon.

Figure 1E:
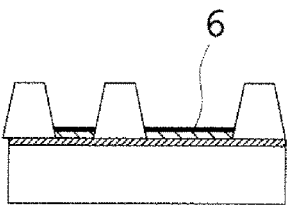

Next, Best Guard AgS-4 was sprayed on the Ni surface (barrier metal layer 5) of the base substrate 3, to make an organic film 6 adsorbed onto the surface, as shown in FIG. 1E.

Figure 1F:
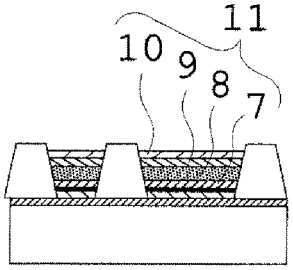

Next, as shown in FIG. 1F, Au electroplating with a metal layer for instrumentation 7 of 0.03 μm was conducted, then Ni electroplating with an electroformed layer 8 of 20 μm was conducted, and further, via a bonding metal layer 9 of 0.01 μm made by Pd electroplating, which enhances adhesion between Ni and Ag, Ag electroplating with a semiconductor element mount layer 10 of 2 μm was conducted, to form an electroformed product 11.

Figure 1G:
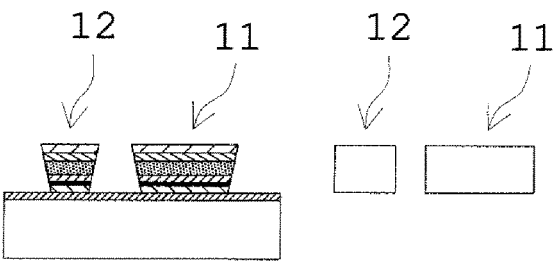

Then, removal of the resist mask layer 4 with an alkaline solution of caustic soda made a substrate for semiconductor element mount having the electroformed product 11 with a reversely tapered shape formed on the base substrate 3, as shown in FIG. 1G.

Embodiment 2

Hereinafter, an explanation will be made of another embodiment in reference to FIGS. 1A-1G. According to this embodiment, the barrier metal layer 5 was made to have a NiP surface.

First, as shown in FIG. 1A, a Cu material of 0.15 mm thickness was used as a first metal layer 1, which was then, as shown in FIG. 1B, Ni electroplated with a second metal layer 2 of 0.3 μm, to form a base substrate 3.

Next, the base substrate was laminated with a dry film resist. Then, exposure and development using a patterned glass mask formed a resist mask layer 4 shown in FIG. 1C, which makes it possible to form an electroformed product with a tapered shape on the base substrate 3.

Next, as shown in FIG. 1D, the second metal layer 2, as uncovered, was NiP electroplated (P content 20%) with 0.3 μm, to form a clean base substrate 3 with a barrier metal layer 5 formed thereon.

Next, the NiP surface of the base substrate 3 was immersed in Best Guard AgS-4, to make an organic film 6 adsorbed onto the surface, as shown in FIG. 1E.

Next, as shown in FIG. 1F, Au electroplating with a metal layer for instrumentation 7 of 0.03 μm was conducted, then Ni electroplating with an electroformed layer 8 of 20 μm was conducted, and further, via a bonding metal layer 9 of 0.01 μm made by Pd electroplating, which enhances adhesion between Ni and Ag, Ag electroplating with a semiconductor element mount layer 10 of 2 μm was conducted, to form an electroformed product 11.

Then, removal of the resist mask layer 4 with an alkaline solution of caustic soda made a substrate for semiconductor element mount having the electroformed product 11 with a reversely tapered shape formed on the base substrate 3, as shown in FIG. 1G.

Embodiment 3

Hereinafter, an explanation will be made of another embodiment in reference to FIGS. 1A-1G. This embodiment shows an example in which the electroformed product 11 of Embodiment 1 was modified to have another configuration.

First, as shown in FIG. 1A, a Cu material of 0.15 mm thickness was used as a first metal layer 1, which was then, as shown in FIG. 1B, Ni electroplated with a second metal layer 2 of 0.3 μm, to form a base substrate 3.

Next, the base substrate was laminated with a dry film resist. Then, exposure and development using a patterned glass mask formed a resist mask layer 4 shown in FIG. 1C, which makes it possible to form an electroformed product with a tapered shape on the base substrate 3.

Next, as shown in FIG. 1D, the second metal layer 2, as uncovered, was Ni electroplated with 0.3 μm, to form a clean base substrate 3 with a barrier metal layer 5 formed thereon.

Next, Best Guard AgS-4 was sprayed on the Ni surface (barrier metal layer 5) of the base substrate 3, to make an organic film 6 adsorbed onto the surface, as shown in FIG. 1E.

Next, as shown in FIG. 1F, Pd electroplating with a metal layer for instrumentation 7 of 0.03 μm was conducted, then Ni electroplating with an electroformed layer 8 of 20 μm was conducted, and further, via a bonding metal layer 9 of 0.01 μm made by Pd electroplating, which enhances adhesion between Ni and Ag, Ag electroplating with a semiconductor element mount layer 10 of 2 μm was conducted, to form an electroformed product 11.

Then, removal of the resist mask layer 4 with an alkaline solution of caustic soda made a substrate for semiconductor element mount having the electroformed product 11 with a reversely tapered shape formed on the base substrate 3, as shown in FIG. 1G.

Embodiment 4

Hereinafter, an explanation will be made of another embodiment in reference to FIGS. 1A-1G. This embodiment shows an example in which the electroformed product 11 of Embodiment 1 was modified to have another configuration.

First, as shown in FIG. 1A, a Cu material of 0.15 mm thickness was used as a first metal layer 1, which was then, as shown in FIG. 1B, Ni electroplated with a second metal layer 2 of 0.3 mm, to form a base substrate 3.

Next, the base substrate was laminated with a dry film resist. Then, exposure and development using a patterned glass mask formed a resist mask layer 4 shown in FIG. 1C, which makes it possible to form an electroformed product with a tapered shape on the base substrate 3.

Next, as shown in FIG. 1D, the second metal layer 2, as uncovered, was Ni electroplated with 0.3 mm, to form a clean base substrate 3 with a barrier metal layer 5 formed thereon.

Next, Best Guard AgS-4 was sprayed on the Ni surface (barrier metal layer 5) of the base substrate 3, to make an organic film 6 adsorbed onto the surface, as shown in FIG. 1E.

Next, as shown in FIG. 1F, Au electroplating with 0.005 mm and Pd electroplating with 0.01 mm were conducted to form a metal layer for instrumentation 7, then Ni electroplating with an electroformed layer 8 of 20 mm was conducted, and further, via a bonding metal layer 9 of 0.01 mm made by Pd electroplating, which enhances adhesion between Ni and Ag, Ag electroplating with a semiconductor element mount layer 10 of 2 mm was conducted, to form an electroformed product 11.

Then, removal of the dry film resist with an alkaline solution of caustic soda made a substrate for semiconductor element mount having the electroformed product 11 with a reversely tapered shape formed on the base substrate 3, as shown in FIG. 1G.

Embodiment 5

Hereinafter, an explanation will be made of another embodiment in reference to FIGS. 1A-1G. This embodiment shows an example in which the electroformed product 11 of Embodiment 1 was modified to have another configuration.

First, as shown in FIG. 1A, a Cu material of 0.15 mm thickness was used as a first metal layer 1, which was then, as shown in FIG. 1B, Ni electroplated with a second metal layer 2 of 0.3 µm, to form a base substrate 3.

Next, the base substrate was laminated with a dry film resist. Then, exposure and development using a patterned glass mask formed a resist mask layer 4 shown in FIG. 1C, which makes it possible to form an electroformed product with a tapered shape on the base substrate 3.

Next, as shown in FIG. 1D, the second metal layer 2, as uncovered, was Ni electroplated with 0.3 µm, to form a clean base substrate 3 with a barrier metal layer 5 formed thereon.

Next, Best Guard AgS-4 was sprayed on the Ni surface (barrier metal layer 5) of the base substrate 3, to make an organic film 6 adsorbed onto the surface, as shown in FIG. 1E.

Next, as shown in FIG. 1F, Au electroplating with a metal layer for instrumentation 7 of 0.03 µm was conducted, then NiP electroplating with an electroformed layer 8 of 20 µm was conducted, and further, via a bonding metal layer 9 of 0.01 µm made by Pd electroplating, which enhances adhesion between Ni and Ag, Ag electroplating with a semiconductor element mount layer 10 of 2 µm was conducted, to form an electroformed product 11.

Then, removal of the resist mask layer 4 with an alkaline solution of caustic soda made a substrate for semiconductor element mount having the electroformed product 11 with a reversely tapered shape formed on the base substrate 3, as shown in FIG. 1G.

Embodiment 6

Hereinafter, an explanation will be made of another embodiment in reference to FIGS. 1A-1G. This embodiment shows an example in which the electroformed product 11 of Embodiment 1 was modified to have another configuration.

First, as shown in FIG. 1A, a Cu material of 0.15 mm thickness was used as a first metal layer 1, which was then, as shown in FIG. 1B, Ni electroplated with a second metal layer 2 of 0.3 µm, to form a base substrate 3.

Next, the base substrate was laminated with a dry film resist. Then, exposure and development using a patterned glass mask formed a resist mask layer 4 shown in FIG. 1C, which makes it possible to form an electroformed product with a tapered shape on the base substrate 3.

Next, as shown in FIG. 1D, the second metal layer 2, as uncovered, was Ni electroplated with 0.3 µm, to form a clean base substrate 3 with a barrier metal layer 5 formed thereon.

Next, Best Guard AgS-4 was sprayed on the Ni surface (barrier metal layer 5) of the base substrate 3, to make an organic film 6 adsorbed onto the surface, as shown in FIG. 1E.

Next, as shown in FIG. 1F, Au electroplating with a metal layer for instrumentation 7 of 0.03 µm was conducted, then Ni electroplating with an electroformed layer 8 of 20 µm was conducted, and further, Pd electroplating with a bonding metal layer 9 of 0.01 µm and Au electroplating with a semiconductor element mount layer 10 of 0.005 µm were conducted, to form an electroformed product 11.

Then, removal of the resist mask layer 4 with an alkaline solution of caustic soda made a substrate for semiconductor element mount having the electroformed product 11 with a reversely tapered shape formed on the base substrate 3, as shown in FIG. 1G.

Embodiment 7

Hereinafter, an explanation will be made of another embodiment in reference to FIGS. 1A-1G. This embodiment shows an example in which the electroformed product 11 of Embodiment 1 was modified to have the electroformed layer 8 undergo roughened Ni plating.

First, as shown in FIG. 1A, a Cu material of 0.15 mm thickness was used as a first metal layer 1, which was then, as shown in FIG. 1B, Ni electroplated with a second metal layer 2 of 0.3 µm, to form a base substrate 3.

Next, the base substrate was laminated with a dry film resist. Then, exposure and development using a patterned glass mask formed a resist mask layer 4 shown in FIG. 1C, which makes it possible to form an electroformed product with a tapered shape on the base substrate 3.

Next, as shown in FIG. 1D, the second metal layer 2, as uncovered, was Ni electroplated with 0.3 µm, to form a clean base substrate 3 with a barrier metal layer 5 formed thereon.

Next, Best Guard AgS-4 was sprayed on the Ni surface (barrier metal layer 5) of the base substrate 3, to make an organic film 6 adsorbed onto the surface, as shown in FIG. 1E.

Next, as shown in FIG. 1F, Au electroplating with a metal layer for instrumentation 7 of 0.03 µm was conducted, and then Ni electroplating was conducted to form an electroformed layer 8, the Ni surface of which further underwent roughened Ni plating of 0.5 µm. Then, via a bonding metal layer 9 of 0.01 µm made by Pd electroplating, which enhances adhesion between Ni and Ag, Ag electroplating with a semiconductor element mount layer 10 of 2 µm was conducted, to form an electroformed product 11.

Then, removal of the resist mask layer 4 with an alkaline solution of caustic soda made a substrate for semiconductor element mount having the electroformed product 11 with a reversely tapered shape formed on the base substrate 3, as shown in FIG. 1G.

Embodiment 8

Hereinafter, an explanation will be made of another embodiment in reference to FIGS. 1A-1G. This embodiment shows an example in which an SPCC material was used as the first metal layer 1.

First, as shown in FIG. 1A, an SPCC material of 0.15 mm thickness was used as a first metal layer 1, which was then, as shown in FIG. 1B, Ni electroplated with a second metal layer 2 of 0.3 µm, to form a base substrate 3.

Next, the base substrate was laminated with a dry film resist. Then, exposure and development using a patterned glass mask formed a resist mask layer 4 shown in FIG. 1C, which makes it possible to form an electroformed product with a tapered shape on the base substrate 3.

Next, as shown in FIG. 1D, the second metal layer 2, as uncovered, was Ni electroplated with 0.3 µm, to form a clean base substrate 3 with a barrier metal layer 5 formed thereon.

Next, Best Guard AgS-4 was sprayed on the Ni surface (barrier metal layer 5) of the base substrate 3, to make an organic film 6 adsorbed onto the surface, as shown in FIG. 1E.

Next, as shown in FIG. 1F, Au electroplating with a metal layer for instrumentation 7 of 0.03 μm was conducted, then Ni electroplating with an electroformed layer 8 of 20 μm was conducted, and further, via a bonding metal layer 9 of 0.01 μm made by Pd electroplating, which enhances adhesion between Ni and Ag, Ag electroplating with a semiconductor element mount layer 10 of 2 μm was conducted, to form an electroformed product 11.

Then, removal of the resist mask layer 4 with an alkaline solution of caustic soda made a substrate for semiconductor element mount having the electroformed product 11 with a reversely tapered shape formed on the base substrate 3, as shown in FIG. 1G.

Embodiment 9

Hereinafter, an explanation will be made of another embodiment in reference to FIGS. 1A-1G. This embodiment shows an example in which an Alloy 42 material was used as the first metal layer 1.

First, as shown in FIG. 1A, an Alloy 42 material of 0.15 mm thickness was used as a first metal layer 1, which was then, as shown in FIG. 1B, Ni electroplated with a second metal layer 2 of 0.3 μm, to form a base substrate 3.

Next, the base substrate was laminated with a dry film resist. Then, exposure and development using a patterned glass mask formed a resist mask layer 4 shown in FIG. 1C, which makes it possible to form an electroformed product with a tapered shape on the base substrate 3.

Next, as shown in FIG. 1D, the second metal layer 2, as uncovered, was Ni electroplated with 0.3 μm, to form a clean base substrate 3 with a barrier metal layer 5 formed thereon.

Next, Best Guard AgS-4 was sprayed on the Ni surface (barrier metal layer 5) of the base substrate 3, to make an organic film 6 adsorbed onto the surface, as shown in FIG. 1E.

Next, as shown in FIG. 1F, Au electroplating with a metal layer for instrumentation 7 of 0.03 μm was conducted, then Ni electroplating with an electroformed layer 8 of 20 μm was conducted, and further, via a bonding metal layer 9 of 0.01 μm made by Pd electroplating, which enhances adhesion between Ni and Ag, Ag electroplating with a semiconductor element mount layer 10 of 2 μm was conducted, to form an electroformed product 11.

Then, removal of the resist mask layer 4 with an alkaline solution of caustic soda made a substrate for semiconductor element mount having the electroformed product 11 with a reversely tapered shape formed on the base substrate 3, as shown in FIG. 1G.

Embodiment 10

Hereinafter, an explanation will be made in reference to FIGS. 2A-2G. According to this embodiment, reprocessing was made by soft etching treatment.

Figure 2A:
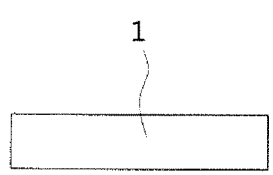
FIGS. 2A-2G are diagrams that show Embodiment 10 of the method for producing a substrate for semiconductor element mount according to the present invention, arranged in sequential order of processes.
Figure 2B:
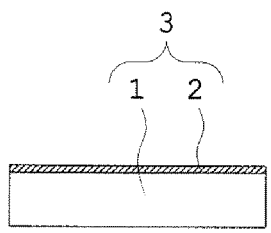
Figure 2C:
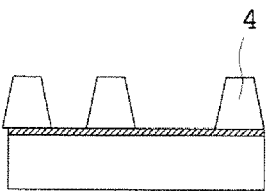

First, as shown in FIG. 2A, a Cu material of 0.15 mm thickness was used as a first metal layer 1, which was then, as shown in FIG. 2B, Ni electroplated with a second metal layer 2 of 2.0 μm, to form a base substrate 3.

Next, the base substrate was laminated with a dry film resist. Then, exposure and development using a patterned glass mask formed a resist mask layer 4 shown in FIG. 2C, which makes it possible to form an electroformed product with a tapered shape on the base substrate 3.

Figure 2D:
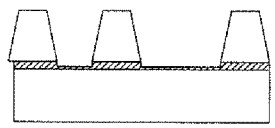

Next, as shown in FIG. 2D, the second metal layer 2, as uncovered, underwent etching treatment of 1.5 μm, to form a clean base substrate 3.

Figure 2E:
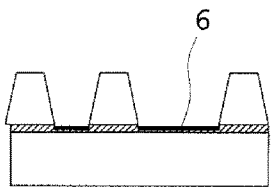

Next, Best Guard AgS-4 was sprayed on the Ni surface of the base substrate 3, to make an organic film 6 adsorbed onto the surface, as shown in FIG. 2E.

Figure 2F:
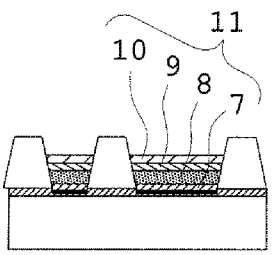

Next, as shown in FIG. 2F, Au electroplating with a metal layer for instrumentation 7 of 0.03 μm was conducted, then Ni electroplating with an electroformed layer 8 of 20 μm was conducted, and further, via a bonding metal layer 9 of 0.01 μm made by Pd electroplating, which enhances adhesion between Ni and Ag, Ag electroplating with a semiconductor element mount layer 10 of 2 μm was conducted, to form an electroformed product 11.

Figure 2G:
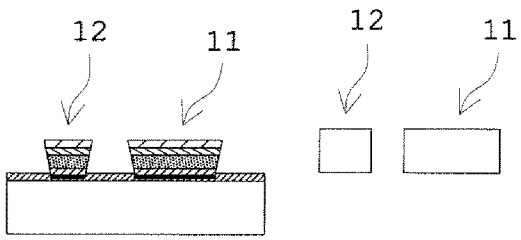

Then, removal of the resist mask layer 4 with an alkaline solution of caustic soda made a substrate for semiconductor element mount having the electroformed product 11 with a reversely tapered shape formed on the base substrate 3, as shown in FIG. 2G.

Embodiment 11

Hereinafter, an explanation will be made in reference to FIGS. 3A-3G. According to this embodiment, reprocessing was made by Ni surface formation after soft etching treatment.

Figure 3A:
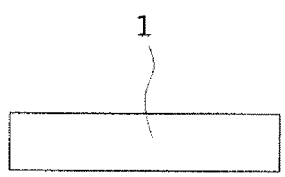
FIGS. 3A-3G are diagrams that show Embodiments 11 to 12 of the method for producing a substrate for semiconductor element mount according to the present invention, arranged in sequential order of processes.
Figure 3B:
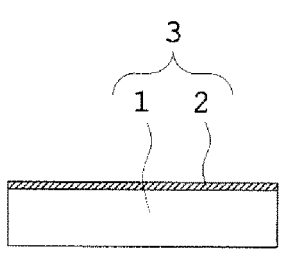
Figure 3C:
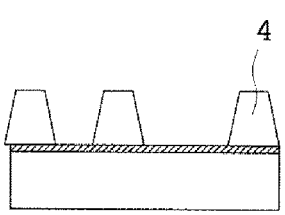

First, as shown in FIG. 3A, a Cu material of 0.15 mm thickness was used as a first metal layer 1, which was then, as shown in FIG. 3B, Ni electroplated with a second metal layer 2 of 0.3 μm, to form a base substrate 3.

Next, the base substrate was laminated with a dry film resist. Then, exposure and development using a patterned glass mask formed a resist mask layer 4 shown in FIG. 3C, which makes it possible to form an electroformed product with a tapered shape on the base substrate 3.

Figure 3D:
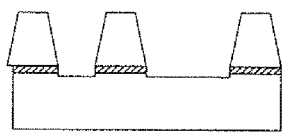

Next, as shown in FIG. 3D, the second metal layer 2, as uncovered, underwent etching treatment of 1.5 μm and Ni electroplating of 0.5 μm, to form a clean base substrate 3 having standoffs with a barrier metal layer 5 formed thereon.

Figure 3E:
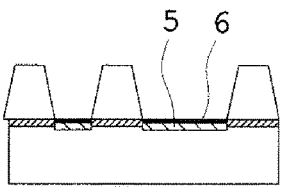

Next, Best Guard AgS-4 was sprayed on the Ni surface (barrier metal layer 5) of the base substrate 3, to make an organic film 6 adsorbed onto the surface, as shown in FIG. 3E.

Figure 3F:
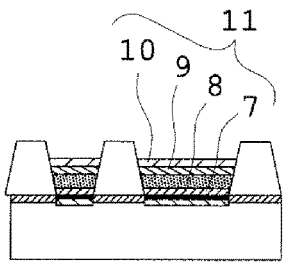

Next, as shown in FIG. 3F, Au electroplating with a metal layer for instrumentation 7 of 0.03 μm was conducted, then Ni electroplating with an electroformed layer 8 of 20 μm was conducted, and further, via a bonding metal layer 9 of 0.01 μm made by Pd electroplating, which enhances adhesion between Ni and Ag, Ag electroplating with a semiconductor element mount layer 10 of 2 μm was conducted, to form an electroformed product 11.

Figure 3G:
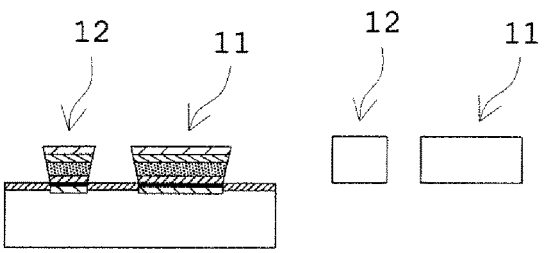

Then, removal of the resist mask layer 4 with an alkaline solution of caustic soda made a substrate for semiconductor element mount having the electroformed product 11 with a reversely tapered shape formed on the base substrate 3, as shown in FIG. 3G.

Embodiment 12

Hereinafter, an explanation will be made of another embodiment in reference to FIGS. 3A-3G. According to this embodiment, reprocessing was made by NiP surface formation after soft etching treatment.

First, as shown in FIG. 3A, a Cu material of 0.15 mm thickness was used as a first metal layer 1, which was then, as shown in FIG. 3B, Ni electroplated with a second metal layer 2 of 0.3 μm, to form a base substrate 3.

Next, the base substrate was laminated with a dry film resist. Then, exposure and development using a patterned glass mask formed a resist mask layer 4 shown in FIG. 3C, which makes it possible to form an electroformed product with a tapered shape on the base substrate 3.

Next, as shown in FIG. 3D, the second metal layer 2, as uncovered, underwent etching treatment of 1.5 μm and NiP electroplating (P content 20%) of 0.5 μm, to form a clean base substrate 3 having standoffs with a barrier metal layer 5 formed thereon.

Next, Best Guard AgS-4 was sprayed on the NiP surface (barrier metal layer 5) of the base substrate 3, to make an organic film 6 adsorbed onto the surface, as shown in FIG. 3E.

Next, as shown in FIG. 3F, Au electroplating with a metal layer for instrumentation 7 of 0.03 μm was conducted, then Ni electroplating with an electroformed layer 8 of 20 μm was conducted, and further, via a bonding metal layer 9 of 0.01 μm made by Pd electroplating, which enhances adhesion between Ni and Ag, Ag electroplating with a semiconductor element mount layer 10 of 2 μm was conducted, to form an electroformed product 11.

Then, removal of the resist mask layer 4 with an alkaline solution of caustic soda made a substrate for semiconductor element mount having the electroformed product 11 with a reversely tapered shape formed on the base substrate 3, as shown in FIG. 3G.

Embodiment 13

Hereinafter, an explanation will be made in reference to FIGS. 4A-4F. This embodiment shows an example in which the reprocessing step was dispensed with.

Figure 4A:
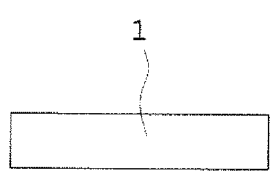
FIGS. 4A-4F are diagrams that show Embodiment 13 of the method for producing a substrate for semiconductor element mount according to the present invention, arranged in sequential order of processes.
Figure 4B:
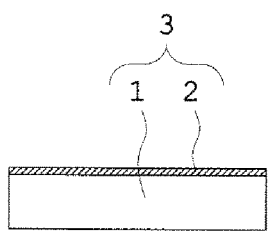
Figure 4C:
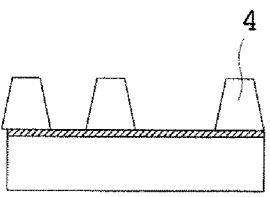

First, as shown in FIG. 4A, a Cu material of 0.15 mm thickness was used as a first metal layer 1, which was then, as shown in FIG. 4B, Ni electroplated with a second metal layer 2 of 0.5 μm, to form a base substrate 3.

Next, the base substrate was laminated with a dry film resist. Then, exposure and development using a patterned glass mask formed a resist mask layer 4 shown in FIG. 4C, which makes it possible to form an electroformed product with a tapered shape on the base substrate 3.

Figure 4D:
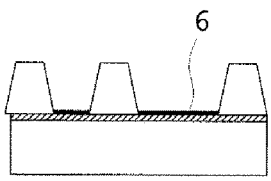

Next, Best Guard AgS-4 was sprayed on the second metal layer 2, to make an organic film 6 adsorbed onto the surface, as shown in FIG. 4D.

Figure 4E:
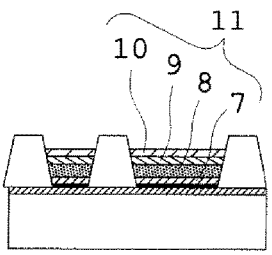

Next, as shown in FIG. 4E, Au electroplating with a metal layer for instrumentation 7 of 0.03 μm was conducted, then Ni electroplating with an electroformed layer 8 of 20 μm was conducted, and further, via a bonding metal layer 9 of 0.01 μm made by Pd electroplating, which enhances adhesion between Ni and Ag, Ag electroplating with a semiconductor element mount layer 10 of 2 μm was conducted, to form an electroformed product 11.

Figure 4F:
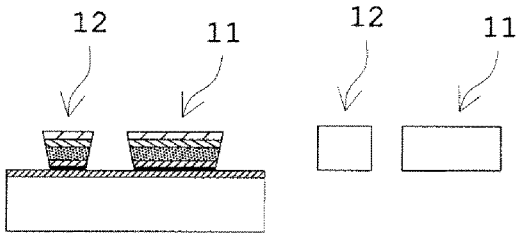

Then, removal of the resist mask layer 4 with an alkaline solution of caustic soda made a substrate for semiconductor element mount having the electroformed product 11 with a reversely tapered shape formed on the base substrate 3, as shown in FIG. 4F.

Embodiment 14

Hereinafter, an explanation will be made in reference to FIGS. 5A-5G. This embodiment shows an example in which the electroformed product 11 was not provided with a bonding metal layer 9.

Figure 5A:
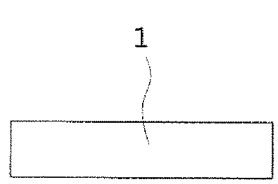
FIGS. 5A-5G are diagrams that show Embodiments 14 to 16 of the method for producing a substrate for semiconductor element mount according to the present invention, arranged in sequential order of processes.
Figure 5B:
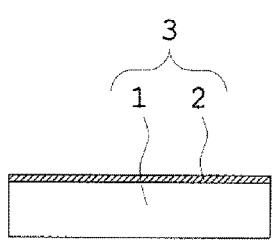
Figure 5C:
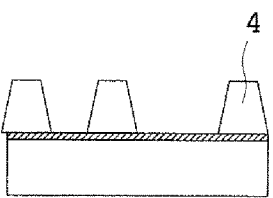

First, as shown in FIG. 5A, a Cu material of 0.15 mm thickness was used as a first metal layer 1, which was then, as shown in FIG. 5B, Ni electroplated with a second metal layer 2 of 0.3 μm, to form a base substrate 3.

Next, the base substrate was laminated with a dry film resist. Then, exposure and development using a patterned glass mask formed a resist mask layer 4 shown in FIG. 5C, which makes it possible to form an electroformed product with a tapered shape on the base substrate 3.

Figure 5D:
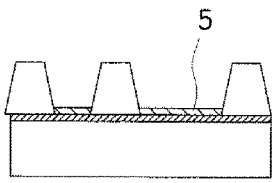

Next, as shown in FIG. 5D, the second metal layer 2, as uncovered, was Ni electroplated with 0.3 μm, to form a clean base substrate 3 with a barrier metal layer 5 formed thereon.

Figure 5E:
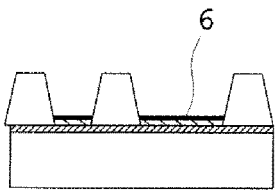

Next, Best Guard AgS-4 was sprayed on the Ni surface (barrier metal layer 5) of the base substrate 3, to make an organic film 6 adsorbed onto the surface, as shown in FIG. 5E.

Figure 5F:
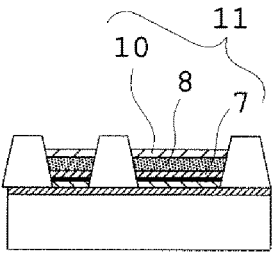

Next, as shown in FIG. 5F, Au electroplating with a metal layer for instrumentation 7 of 0.03 μm was conducted, then Cu electroplating with an electroformed layer 8 of 20 μm was conducted, and further, Ag electroplating with a semiconductor element mount layer 10 of 2 μm was conducted, to form an electroformed product 11.

Figure 5G:
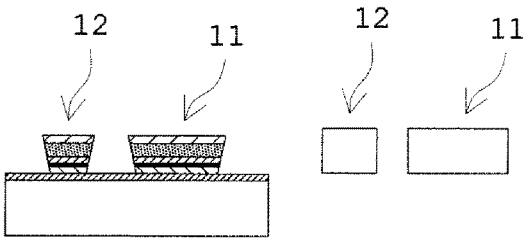

Then, removal of the resist mask layer 4 with an alkaline solution of caustic soda made a substrate for semiconductor element mount having the electroformed product 11 with a reversely tapered shape formed on the base substrate 3, as shown in FIG. 5G.

Embodiment 15

Hereinafter, an explanation will be made in reference to FIGS. 5A-5G. This embodiment shows an example in which the electroformed product 11 of Embodiment 14 was modified to have another configuration.

First, as shown in FIG. 5A, a Cu material of 0.15 mm thickness was used as a first metal layer 1, which was then, as shown in FIG. 5B, Ni electroplated with a second metal layer 2 of 0.3 μm, to form a base substrate 3.

Next, the base substrate was laminated with a dry film resist. Then, exposure and development using a patterned glass mask formed a resist mask layer 4 shown in FIG. 5C, which makes it possible to form an electroformed product with a tapered shape on the base substrate 3.

Next, as shown in FIG. 5D, the second metal layer 2, as uncovered, was Ni electroplated with 0.3 μm, to form a clean base substrate 3 with a barrier metal layer 5 formed thereon.

Next, Best Guard AgS-4 was sprayed on the Ni surface (barrier metal layer 5) of the base substrate 3, to make an organic film 6 adsorbed onto the surface, as shown in FIG. 5E.

Next, as shown in FIG. 5F, Au electroplating with a metal layer for instrumentation 7 of 0.03 μm was conducted, then Ni electroplating with an electroformed layer 8 of 20 μm was conducted, and further, Au electroplating with a semiconductor element mount layer 10 of 0.01 μm was conducted, to form an electroformed product 11.

Then, removal of the resist mask layer 4 with an alkaline solution of caustic soda made a substrate for semiconductor element mount having the electroformed product 11 with a reversely tapered shape formed on the base substrate 3, as shown in FIG. 5G.

Embodiment 16

Hereinafter, an explanation will be made in reference to FIGS. 5A-5G. This embodiment shows an example in which the electroformed product 11 of Embodiment 14 was modified to have another configuration.

First, as shown in FIG. 5A, a Cu material of 0.15 mm thickness was used as a first metal layer 1, which was then, as shown in FIG. 5B, Ni electroplated with a second metal layer 2 of 0.3 µm, to form a base substrate 3.

Next, the base substrate was laminated with a dry film resist. Then, exposure and development using a patterned glass mask formed a resist mask layer 4 shown in FIG. 5C, which makes it possible to form an electroformed product with a tapered shape on the base substrate 3.

Next, as shown in FIG. 5D, the second metal layer 2, as uncovered, was Ni electroplated with 0.3 µm, to form a clean base substrate 3 with a barrier metal layer 5 formed thereon.

Next, Best Guard AgS-4 was sprayed on the Ni surface (barrier metal layer 5) of the base substrate 3, to make an organic film 6 adsorbed onto the surface, as shown in FIG. 5E.

Next, as shown in FIG. 5F, Au electroplating with a metal layer for instrumentation 7 of 0.03 µm was conducted, then Ni electroplating with an electroformed layer 8 of 20 µm was conducted, and further, via a layer by Ag strike, Au electroplating with a semiconductor element mount layer 10 of 0.01 µm was conducted, to form an electroformed product 11.

Then, removal of the resist mask layer 4 with an alkaline solution of caustic soda made a substrate for semiconductor element mount having the electroformed product 11 with a reversely tapered shape formed on the base substrate 3, as shown in FIG. 5G.

Embodiment 17

Hereinafter, an explanation will be made in reference to FIGS. 6A-6G. This embodiment shows an example in which the electroformed product 11 was formed to have a reversely tapered shape and, in a plan view, a jagged shape.

Figure 6A:
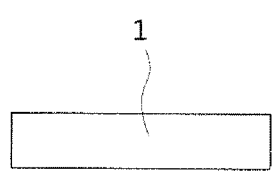
FIGS. 6A-6G are diagrams that show Embodiment 17 of the method for producing a substrate for semiconductor element mount according to the present invention, arranged in sequential order of processes.
Figure 6B:
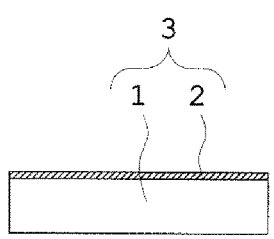
Figure 6C:
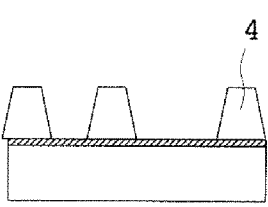

First, as shown in FIG. 6A, a Cu material of 0.15 mm thickness was used as a first metal layer 1, which was then, as shown in FIG. 6B, Ni electroplated with a second metal layer 2 of 0.3 µm, to form a base substrate 3.

Next, the base substrate was laminated with a dry film resist. Then, exposure and development using a patterned glass mask formed a resist mask layer 4 shown in FIG. 6C, which makes it possible to form, on the base substrate 3, an electroformed product having a tapered shape as well as, in a plan view, a jagged shape as shown in FIG. 6G'.

Figure 6D:
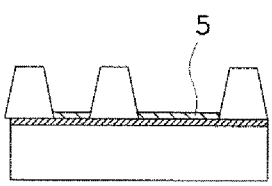

Next, as shown in FIG. 6D, the second metal layer 2, as uncovered, was Ni electroplated with 0.3 µm, to form a clean base substrate 3 with a barrier metal layer 5 formed thereon.

Figure 6E:
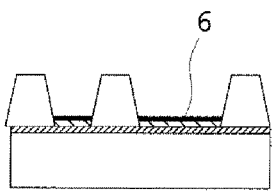

Next, Best Guard AgS-4 was sprayed on the Ni surface (barrier metal layer 5) of the base substrate 3, to make an organic film 6 adsorbed onto the surface, as shown in FIG. 6E.

Figure 6F:
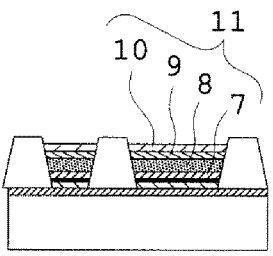
Figure 6G:
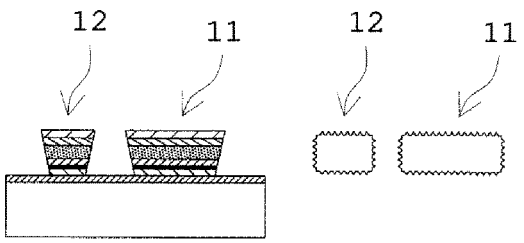

Next, as shown in FIG. 6F, Au electroplating with a metal layer for instrumentation 7 of 0.03 µm was conducted, then Ni electroplating with an electroformed layer 8 of 20 µm was conducted, and further, via a bonding metal layer 9 of 0.01 µm made by Pd electroplating, which enhances adhesion between Ni and Ag, Ag electroplating with a semiconductor element mount layer 10 of 2 µm was conducted, to form an electroformed product 11.

Then, removal of the resist mask layer 4 with an alkaline solution of caustic soda made a substrate for semiconductor element mount having the electroformed product 11 with a reversely tapered shape as shown in FIG. 6G and, in a plan view, a jagged shape as shown in FIG. 6G', formed on the base substrate 3.

Embodiment 18

Hereinafter, an explanation will be made in reference to FIGS. 7A-7G. This embodiment shows an example in which the electroformed product 11 was formed to have a mushroom shape.

Figure 7A:
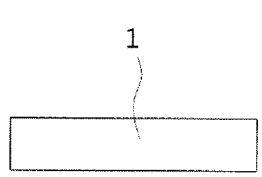
FIGS. 7A-7G are diagrams that show Embodiment 18 of the method for producing a substrate for semiconductor element mount according to the present invention, arranged in sequential order of processes.
Figure 7B:
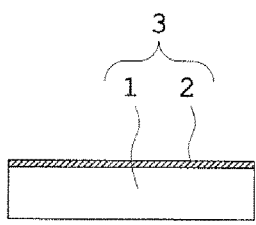
Figure 7C:
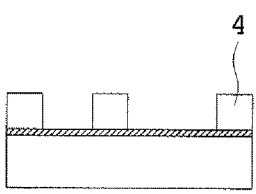

First, as shown in FIG. 7A, a Cu material of 0.15 mm thickness was used as a first metal layer 1, which was then, as shown in FIG. 7B, Ni electroplated with a second metal layer 2 of 0.3 µm, to form a base substrate 3.

Next, the base substrate was laminated with a dry film resist of 20 µm thickness. Then, exposure and development using a patterned glass mask formed a resist mask layer 4 shown in FIG. 7C.

Figure 7D:
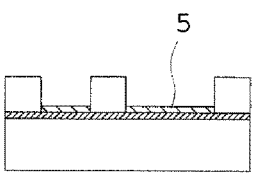

Next, as shown in FIG. 7D, the second metal layer 2, as uncovered, was Ni electroplated with 0.3 µm, to form a clean base substrate 3 with a barrier metal layer 5 formed thereon.

Figure 7E:
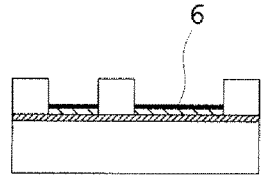

Next, Best Guard AgS-4 was sprayed on the Ni surface (barrier metal layer 5) of the base substrate 3, to make an organic film 6 adsorbed onto the surface, as shown in FIG. 7E.

Figure 7F:
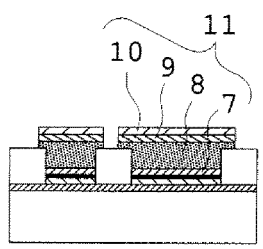

Next, as shown in FIG. 7F, Au electroplating with a metal layer for instrumentation 7 of 0.03 µm was conducted, then Ni electroplating with an electroformed layer 8 of 35 µm was conducted to top the resist mask layer 4 so that an electroformed product radially spread to have a mushroom shape. Further, via a bonding metal layer 9 of 0.01 µm made by Pd electroplating, which enhances adhesion between Ni and Ag, Ag electroplating with a semiconductor element mount layer 10 of 2 µm was conducted, to form an electroformed product 11.

Figure 7G:
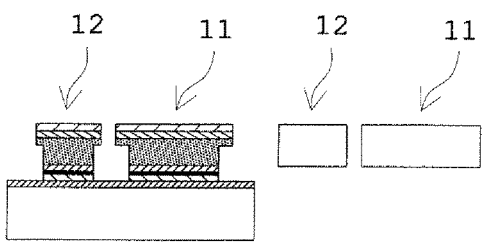

Then, removal of the resist mask layer 4 with an alkaline solution of caustic soda made a substrate for semiconductor element mount having the electroformed product 11 with a mushroom shape formed on the base substrate 3, as shown in FIG. 7G.

Embodiment 19

Hereinafter, an explanation will be made in reference to FIGS. 8A-8G. This embodiment shows an example in which the electroformed product 11 was formed to have a jagged shape in a plan view.

Figure 8A:
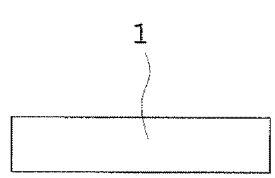
FIGS. 8A-8G are diagrams that show Embodiment 19 of the method for producing a substrate for semiconductor element mount according to the present invention, arranged in sequential order of processes.
Figure 8B:
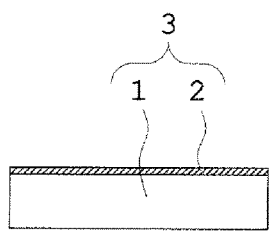

First, as shown in FIG. 8A, a Cu material of 0.15 mm thickness was used as a first metal layer 1, which was then, as shown in FIG. 8B, Ni electroplated with a second metal layer 2 of 0.3 µm, to form a base substrate 3.

Figure 8C:
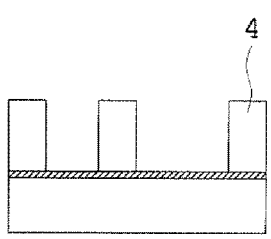

Next, the base substrate was laminated with a dry film resist. Then, exposure and development using a patterned glass mask formed a resist mask layer 4, which makes it possible to form, on the base substrate 3, an electroformed product having a jagged shape in a plan view, as shown in FIGS. 8C and 8G'.

Figure 8D:
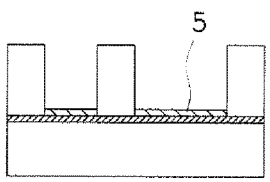

Next, as shown in FIG. 8D, the second metal layer 2, as uncovered, was Ni electroplated with 0.3 µm, to form a clean base substrate 3 with a barrier metal layer 5 formed thereon.

Figure 8E:
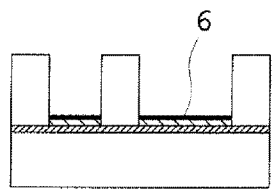

Next, Best Guard AgS-4 was sprayed on the Ni surface (barrier metal layer 5) of the base substrate 3, to make an organic film 6 adsorbed onto the surface, as shown in FIG. 8E.

Figure 8F:
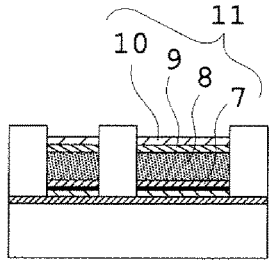
Figure 8G:
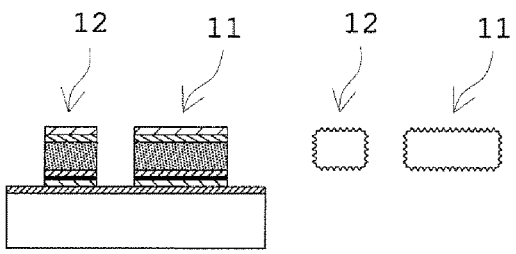

Next, as shown in FIG. 8F, Au electroplating with a metal layer for instrumentation 7 of 0.03 µm was conducted, then Ni electroplating with an electroformed layer 8 of 20 µm was conducted, and further, via a bonding metal layer 9 of 0.01 µm made by Pd electroplating, which enhances adhesion between Ni and Ag, Ag electroplating with a semiconductor element mount layer 10 of 2 μm was conducted, to form an electroformed product 11.

Then, removal of the resist mask layer 4 with an alkaline solution of caustic soda made a substrate for semiconductor element mount having the electroformed product 11 with a jagged shape in a plan view formed on the base substrate 3, as shown in FIGS. 8G and 8G'.

When a semiconductor device is to be produced using the substrate for semiconductor element mount produced by the method of the present invention, a semiconductor element is mounted on the semiconductor element mount portion, the semiconductor element and the electrode terminal portion are electrically connected, and the semiconductor element mount portion, the semiconductor element, and the electrode terminal portion are resin-sealed together, to form a resin-sealed product. Then, the base substrate including the second metal layer or the reprocessed surface is peeled off and removed. Since the metal layer for instrumentation is formed on the second metal layer or the reprocessed surface (the barrier metal layer) via the organic film, the base substrate including the second metal layer or the reprocessed surface (the barrier metal layer) can be easily peeled off the metal layer for instrumentation.

While the preferred embodiments of the present invention have been described above, the present invention is not limited to the embodiments described above; various modifications and substitutions can be applied to the above-described embodiments as far as they stay within the scope of the invention.

The invention claimed is:

1. A method for producing a substrate for semiconductor element mount using a semiconductor element mounted on a semiconductor element mount portion, the semiconductor element and an electrode terminal portion electrically connected and resin-sealed, and a base substrate, which includes a reprocessed surface, is peeled off and removed, comprising the steps of:
   (1) preparing the base substrate having, on a first metal layer, a second metal layer made of Ni or NiP through which a metal layer for instrumentation is hardly diffusible;
   (2) forming, on the second metal layer of the base substrate, a resist mask layer which has been patterned;
   (3) placing a surface of the second metal layer remaining uncovered off the resist mask layer under reprocessing treatment by Ni- or NiP-electroplating, to form the reprocessed surface;
   (4) providing the reprocessed surface of the base substrate with an organic film that controls adhesion between the metal layer for instrumentation and the reprocessed surface by a liquid agent containing a component that shows a nature of amphoteric surfactant;
   (5) forming the metal layer for instrumentation on the reprocessed surface of the base substrate via the organic film;
   (6) forming, on the metal layer for instrumentation, the semiconductor element mount portion and the electrode terminal portion by electroforming; and
   (7) removing the resist mask from the second metal layer of the base substrate.

2. The method for producing a substrate for semiconductor element mount according to claim 1,
   wherein the component that shows a nature of amphoteric surfactant is betaine-type, aminoxide-type or amino acid-type.

3. The method for producing a substrate for semiconductor element mount according to claim 1,
   wherein the first metal layer is made of any one of Cu, SPCC and Alloy 42.

4. The method for producing a substrate for semiconductor element mount according to claim 1,
   wherein the metal layer for instrumentation is made of any one of Au, Pd and Au/Pd.

5. A method for producing a substrate for semiconductor element mount using a semiconductor element mounted on a semiconductor element mount portion, the semiconductor element and an electrode terminal portion electrically connected and resin-sealed, and a base substrate, which includes a reprocessed surface, is peeled off and removed, comprising the steps of:
   (1) preparing the base substrate having, on a first metal layer, a second metal layer made of Ni or NiP through which a metal layer for instrumentation is hardly diffusible;
   (2) forming, on the second metal layer of the base substrate, a resist mask layer which has been patterned;
   (3) placing a surface of the second metal layer remaining uncovered off the resist mask layer under reprocessing treatment by any one of soft etching, Ni electroplating after soft etching, and NiP electroplating after soft etching, to form the reprocessed surface;
   (4) providing the reprocessed surface of the base substrate with an organic film that controls adhesion between the metal layer for instrumentation and the reprocessed surface by a liquid agent containing a component that shows a nature of amphoteric surfactant;
   (5) forming the metal layer for instrumentation on the reprocessed surface of the base substrate via the organic film;
   (6) forming, on the metal layer for instrumentation, the semiconductor element mount portion and the electrode terminal portion by electroforming; and
   (7) removing the resist mask from the second metal layer of the base substrate.

6. The method for producing a substrate for semiconductor element mount according to claim 5,
   wherein the component that shows a nature of amphoteric surfactant is betaine-type, aminoxide-type or amino acid-type.

7. The method for producing a substrate for semiconductor element mount according to claim 5,
   wherein the first metal layer is made of any one of Cu, SPCC and Alloy 42.

8. The method for producing a substrate for semiconductor element mount according to claim 5,
   wherein the metal layer for instrumentation is made of any one of Au, Pd and Au/Pd.

9. A method for producing a substrate for semiconductor element mount using a semiconductor element mounted on a semiconductor element mount portion, the semiconductor element and an electrode terminal portion electrically connected and resin-sealed, and a base substrate, which includes a second metal layer, is peeled off and removed, comprising the steps of:
   (1) preparing the base substrate having, on a first metal layer, the second metal layer through which a metal layer for instrumentation is hardly diffusible;
   (2) forming, on the second metal layer of the base substrate, a resist mask layer which has been patterned;
   (3) providing the second metal layer of the base substrate with an organic film that controls adhesion between the metal layer for instrumentation and the second metal layer by a liquid agent containing a component that shows a nature of amphoteric surfactant;
(4) forming the metal layer for instrumentation on the second metal layer of the base substrate via the organic film;
(5) forming, on the metal layer for instrumentation, the semiconductor element mount portion and the electrode terminal portion by electroforming; and
(6) removing the resist mask from the second metal layer of the base substrate.

10. The method for producing a substrate for semiconductor element mount according to claim 9,
wherein the component that shows a nature of amphoteric surfactant is betaine-type, aminoxide-type or amino acid-type.

11. The method for producing a substrate for semiconductor element mount according to claim 9,
wherein the first metal layer is made of any one of Cu, SPCC and Alloy 42.

12. The method for producing a substrate for semiconductor element mount according to claim 9,
wherein the metal layer for instrumentation is made of any one of Au, Pd and Au/Pd.

\* \* \* \* \*